(12) United States Patent
Noshiro

(10) Patent No.: US 8,227,782 B2
(45) Date of Patent: Jul. 24, 2012

(54) RESISTANCE CHANGE ELEMENT AND METHOD OF MANUFACTURING THE SAME

(75) Inventor: Hideyuki Noshiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/487,214

(22) Filed: Jun. 18, 2009

(65) Prior Publication Data

US 2009/0257271 A1 Oct. 15, 2009

Related U.S. Application Data

(63) Continuation of application No. PCT/JP2007/060451, filed on May 22, 2007.

(30) Foreign Application Priority Data

Dec. 19, 2006 (WO) .................. PCT/JP2006/325295

(51) Int. Cl.
*H01L 29/02* (2006.01)
*H01L 47/00* (2006.01)

(52) U.S. Cl. ..................... 257/2; 257/E45.003; 365/148; 438/104; 438/650

(58) Field of Classification Search ....... 257/2, E45.003; 438/104, 650; 365/148
See application file for complete search history.

(56) References Cited

U.S. PATENT DOCUMENTS

| | | | |
|---|---|---|---|
| 6,169,305 B1 | 1/2001 | Takai et al. | |
| 6,211,035 B1 | 4/2001 | Moise et al. | |
| 6,444,542 B2 | 9/2002 | Moise et al. | |
| 6,534,326 B1 | 3/2003 | Hsu et al. | |
| 6,649,957 B2 | 11/2003 | Hsu et al. | |
| 6,849,891 B1 | 2/2005 | Hsu et al. | |
| 6,902,939 B2 | 6/2005 | Moise et al. | |
| 6,979,881 B2 | 12/2005 | Joo et al. | |
| 7,145,791 B2 * | 12/2006 | Tsushima et al. | 365/148 |
| 7,348,616 B2 | 3/2008 | Joo et al. | |
| 7,525,832 B2 | 4/2009 | Muraoka et al. | |
| 2004/0170040 A1 * | 9/2004 | Rinerson et al. | 365/26 |
| 2004/0245557 A1 | 12/2004 | Seo et al. | |
| 2005/0153504 A1 | 7/2005 | Kawazoe et al. | |
| 2005/0206892 A1 | 9/2005 | Wang et al. | |

(Continued)

FOREIGN PATENT DOCUMENTS

JP 2000-91539 A 3/2000

(Continued)

OTHER PUBLICATIONS

International Search Report of PCT/JP2007/060451, Mailing Date of Jul. 31, 2007.

(Continued)

*Primary Examiner* — Jarrett Stark
(74) *Attorney, Agent, or Firm* — Westerman, Hattori, Daniels & Adrian, LLP

(57) ABSTRACT

In a resistance change memory (ReRAM) storing data by utilizing change in resistance of a resistance change element, a lower electrode (ground-side electrode) of the resistance change element is formed of a transition metal such as Ni, and an upper electrode (positive polarity-side electrode) is configured of a noble metal such as Pt. In addition, a transition metal oxide film between the lower electrode and the upper electrode is formed of an oxide film (NiOx film) of a transition metal that is of the same kind as the transition metal constituting the lower electrode, for example.

5 Claims, 12 Drawing Sheets

U.S. PATENT DOCUMENTS

| | | | |
|---|---|---|---|
| 2006/0071272 A1* | 4/2006 | Alvarado et al. | 257/342 |
| 2006/0098472 A1 | 5/2006 | Ahn et al. | |
| 2007/0041235 A1* | 2/2007 | Inoue | 365/148 |
| 2008/0106925 A1* | 5/2008 | Paz de Araujo et al. | 365/148 |
| 2009/0067215 A1 | 3/2009 | Muraoka et al. | |

FOREIGN PATENT DOCUMENTS

| | | |
|---|---|---|
| JP | 2000-133633 A | 5/2000 |
| JP | 2003-229540 A | 8/2003 |
| JP | 2003-273333 A | 9/2003 |
| JP | 2004-146551 A | 5/2004 |
| JP | 2004-296735 A | 10/2004 |
| JP | 2004-363604 A | 12/2004 |
| JP | 2005-175457 A | 6/2005 |
| JP | 2005-203389 A | 7/2005 |
| JP | 2006-140489 A | 6/2006 |
| JP | 2006-324447 A | 11/2006 |
| WO | 2005/024839 A1 | 3/2005 |
| WO | 2006-115208 A1 | 11/2006 |

OTHER PUBLICATIONS

Kinoshita K. et al., "Bias Polarity Dependent Data Retention of Resistive Random Access Memory Consisting of Binary Transition Metal Oxide." Applied Physics Letters. 2006, col. 89.

Seo S. et al., "Reproducible resistance switching in polycrystalline Nio films." Applied Physics Letters. Dec. 6, 2004, vol. 85, No. 23.

Lee M. D. et al., "Effect of oxygen concentration on Characteristics of NiOx-based resistance random access memory." IEEE Transactions on Magnetics, Feb. 2, 2007, vol. 43, No. 2.

Korean Office Action dated Aug. 31, 2011, issued in corresponding Korean Patent Application No. 10-2009-7012536.

* cited by examiner

RESISTANCE CHANGE ELEMENT AND METHOD OF MANUFACTURING THE SAME

CROSS-REFERENCE TO RELATED APPLICATIONS

This application is a continuation of prior International Patent Application No. PCT/JP2007/060451, filed May 22, 2007, the entire contents of which are incorporated herein by reference.

FIELD

The embodiments discussed herein relate to a resistance change element storing data by utilizing change in a resistance value and a method of manufacturing the same.

BACKGROUND

In recent years, further size reduction, lower power consumption and higher functionality have been demanded for information apparatuses such as computers. Along with these demands, there has also been a demand for non-volatile semiconductor memories that enable higher integration, operate at a higher speed, and retain stored data even when power is not supplied. As one of the next generation non-volatile semiconductor memories capable of meeting such demands, a resistance change memory (Resistive Random Access Memory: hereinafter referred to as "ReRAM") including a resistance change element has been developed (see, for example, Non Patent Citations 1, 2).

In a ReRAM, data is stored by utilizing change in a resistance value of a resistance change element. As depicted in FIG. 1, the resistance change element is configured such that an NiO film (nickel oxide film) 12 or another transition metal oxide film is sandwiched in between a pair of electrodes 11$a$, 11$b$ made of Pt (platinum). When a treatment applying a predetermined voltage to the resistance change element configured as such (electroforming: hereinafter referred to as "forming") is carried out, it is possible to change the resistance value by controlling the current and voltage.

FIG. 2 is a view depicting the state change of the resistance change element by taking the horizontal axis as voltage and the vertical axis as current. As depicted in this FIG. 2, the resistance change element transitions between a high resistance state and a low resistance state according to the current flowing through the inside of the resistance change element and the voltage applied thereto. In the high resistance state, as depicted by a in the Figure, the current flowing through the inside of the resistance change element increases as the applied voltage becomes higher, while the inclination of the curved line depicting the relationship between the voltage and the current is relatively small. In contrast, when the applied voltage becomes equal to or higher than a specified voltage (as depicted by b in FIG. 2), the resistance value decreases rapidly (as depicted by c in the Figure). As a result, the current increases rapidly. For this reason, a limiter circuit for preventing rapid current increase is provided for the ReRAM so as to prevent a large current from flowing into the resistance change element.

In the low resistance state, as depicted by d in the Figure, the inclination of the curved line depicting the relationship between the voltage and the current is large. When the current flowing into the resistance change element becomes a specified value (as depicted by e in the Figure), the resistance change element transitions to the high resistance state (as depicted by f in the Figure), and the current decreases rapidly.

As described above, the resistance change element transitions to the low resistance state when a voltage equal to or higher than a specified voltage is applied in the high resistance state, while the resistance change element transitions to the high resistance state when a current equal to or higher than a specified current is applied in the low resistance state. The resistance value in the low resistance state is approximately several k$\Omega$ and the resistance value in the high resistance state is from approximately several tens k$\Omega$ to 1 M$\Omega$. Note that, in general, the change from the high resistance state to the low resistance state is referred to as "set" and the change from the low resistance state to the high resistance state is referred to as "reset".

Since the NiO film constituting the resistance change element is an oxide, the electrodes holding both sides of the NiO film is an easily-oxidizable state. For this reason, the electrodes of the resistance change element are formed of a metal which is hardly oxidized. Specifically, the electrodes are formed of a noble metal such as Pt or Ir (iridium). Patent Citation 1 describes a non-volatile memory having a resistance change element with the structure in which a film made of any of transition metal oxides such as NiO, $TiO_2$, HfO, ZrO, ZnO, $WO_3$, COO, and $Nb_2O_5$ is sandwiched in between a pair of electrodes.

Other conventional techniques which presumably relate to the embodiments are disclosed in Patent Citations 2 to 8. Patent Citation 2 discloses that an electrode is formed of Pt (platinum), Ir (iridium), IrO (iridium oxide), RuO (ruthenium oxide) or the like in a polycrystalline memory having a thin film made of a polycrystalline memory material such as a perovskite or a ferroelectric substance. In addition, Patent Citations 3 to 7 disclose that an upper electrode is formed to have a laminated structure of, for example, Pt and PtO in a semiconductor device (memory) having a ferroelectric capacitor. Furthermore, Patent Citation 8 discloses the structure in which an oxidation resistant layer made of TiN, TaN, or the like and a refractory metal layer made of Pt, Ir, $IrO_2$, Ru, $RuO_2$, or the like are laminated in RRAM having a colossal magnetoresistive (CMR) metal layer.

Patent Citation 1: Japanese Laid-open Patent Application Publication No. 2006-140489
Patent Citation 2: Japanese Laid-open Patent Application Publication No. 2003-273333
Patent Citation 3: Japanese Laid-open Patent Application Publication No. 2000-133633
Patent Citation 4: Japanese Laid-open Patent Application Publication No. 2000-91539
Patent Citation 5: Japanese Laid-open Patent Application Publication No. 2004-296735
Patent Citation 6: Japanese Laid-open Patent Application Publication No. 2004-146551
Patent Citation 7: Japanese Laid-open Patent Application Publication No. 2003-229540
Patent Citation 8: Japanese Laid-open Patent Application Publication No. 2005-175457
Non Patent Citation 1: K. Kinoshita et al., "Bias polarity dependent data retention of resistive random access memory consisting of binary transition metal oxide", APPLIED PHYSICS LETTER 89, 103509 (2006)
Non Patent Citation 2: S. Seo et al., "Reproducible resistance switching in polycrystalline NiO films", APPLIED PHYSICS LETTER Vol. 85, No. 23, 6 Dec. 2004

SUMMARY

According to an aspect of the embodiments, a resistance change element is configured of a ground-side electrode made of a transition metal, a positive polarity-side electrode made of any one of a noble metal and a noble metal oxide, and a transition metal oxide film disposed between the ground-side electrode and the positive polarity-side electrode.

According to another aspect of the embodiments, a method of manufacturing a resistance change element includes forming a transition metal film above a semiconductor substrate, forming a transition metal oxide film on the transition metal film, and forming a noble metal film made of any one of a noble metal and a noble metal oxide on the transition metal oxide film. In addition, the transition metal oxide film may be formed by oxidizing a surface of the transition metal film.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Figure 1:
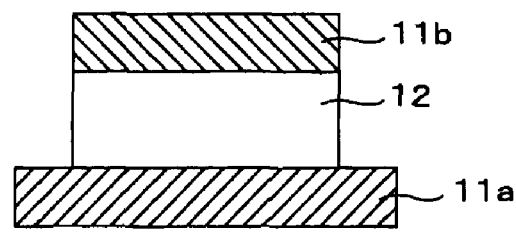
FIG. 1 is a cross-sectional view depicting a related resistance change element.
Figure 2:
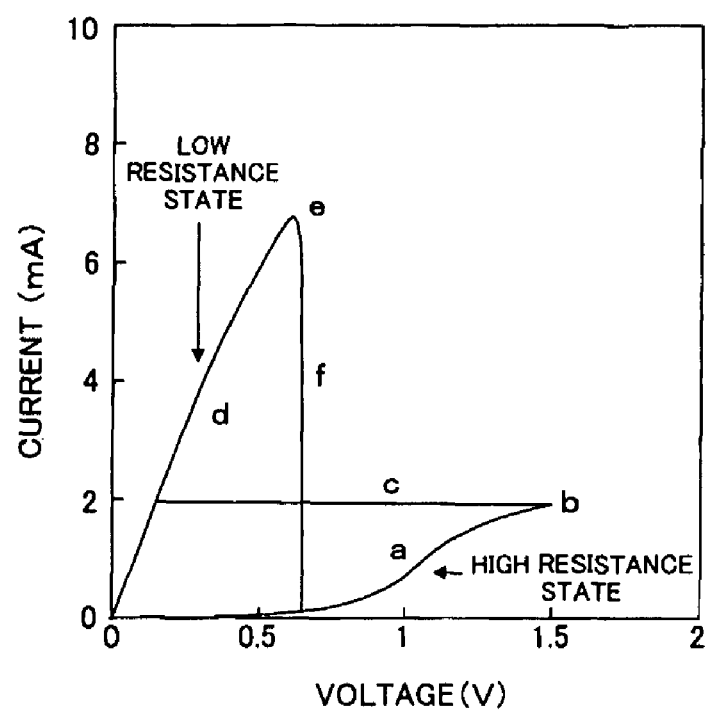
FIG. 2 is a view depicting an example of the state change of the resistance change element.

The inventor of the present application and the like have found the following problem in a related ReRAM. Specifically, as depicted in FIG. 2, a related resistance change element needs to receive a current of several mA to 10 mA or more in order to transition from the low resistance state to the high resistance state. On the other hand, unless a current flowing through each cell is set to be equal to or less than 1 mA, the power consumption of a semiconductor storage device (IC) is so huge, but depending on its required memory capacity, that the commercialization thereof is difficult. Accordingly, there is a demand for the resistance change element that can reduce current per cell.

The inventor of the present application and the like have carried out various experiments and studies with an intention to reduce the driving current of ReRAM. As a result, it has been found that the driving current of ReRAM can be reduced when an electrode of a resistance change element on the ground-side (negative polarity-side) is formed of Ni (nickel). It is not apparent why the driving current decreases when the ground-side electrode of the resistance change element is formed of Ni. However, the reason is presumably that if the ground-side electrode is formed of a noble metal, the diffusion of elements from the noble metal electrode to the transition metal oxide film or the diffusion of oxygen from the transition metal oxide film to the noble metal electrode is generated to cause driving voltage to be higher and driving current to be larger, whereas if the ground-side electrode is formed of Ni, such a phenomenon is not generated.

Hereinafter, preferred embodiments will be described with reference to the accompanying drawings.

1. First Embodiment

Figure 3:
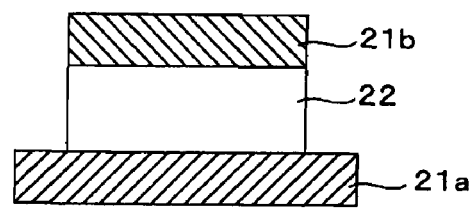
FIG. 3 is a cross-sectional view depicting a resistance change element according to a first embodiment.

FIG. 3 is a cross-sectional view depicting a resistance change element according to a first embodiment. As depicted in this FIG. 3, the resistance change element according to the present embodiment is configured of a lower electrode (ground-side electrode) 21a made of Ni (nickel), a transition metal oxide film 22 made of NiOx (nickel oxide film), and an upper electrode (positive polarity-side electrode) 21b made of Pt (platinum). Here, x in NiOx is any positive number, and is preferably larger than 0 and less than 2 in order to obtain a preferable characteristic.

The lower electrode 21a may be formed of a transition metal other than Ni, for example, Ti (titanium), Co (cobalt), or Ta (tantalum). In this case, however, it is preferable that the transition metal oxide film 22 be formed of an oxide film of the transition metal constituting the lower electrode 21a, for example, a $TiO_2$ film, a CoO film, or a $Ta_2O_5$ film. In addition, the upper electrode 21b may be formed of a noble metal other than Pt, for example, Pd (palladium), Ru (ruthenium), or Ir (iridium), or an oxide thereof.

Figure 4:
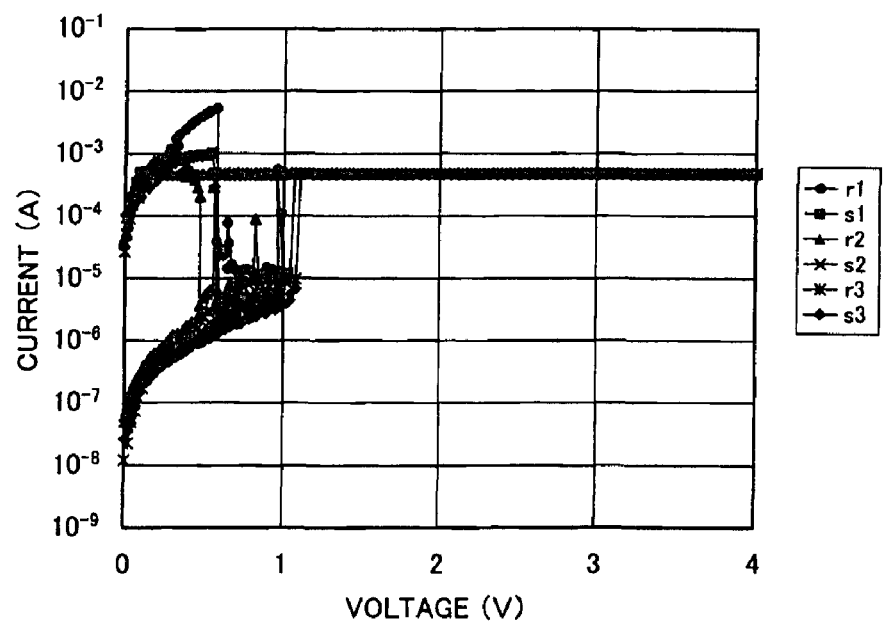
FIG. 4 is a view depicting the characteristic of a resistance change element according to a practical example.

FIG. 4 is a view depicting the characteristic of the resistance change element according to the present embodiment depicted in FIG. 3 (hereinafter referred to as a practical example) by taking the horizontal axis as voltage and the vertical axis as current. Here, the thickness of the lower electrode 21a is 100 nm, the thickness of the transition metal oxide film 22 is 50 nm, and the thickness of the upper electrode 21b is 50 nm.

Figure 5:
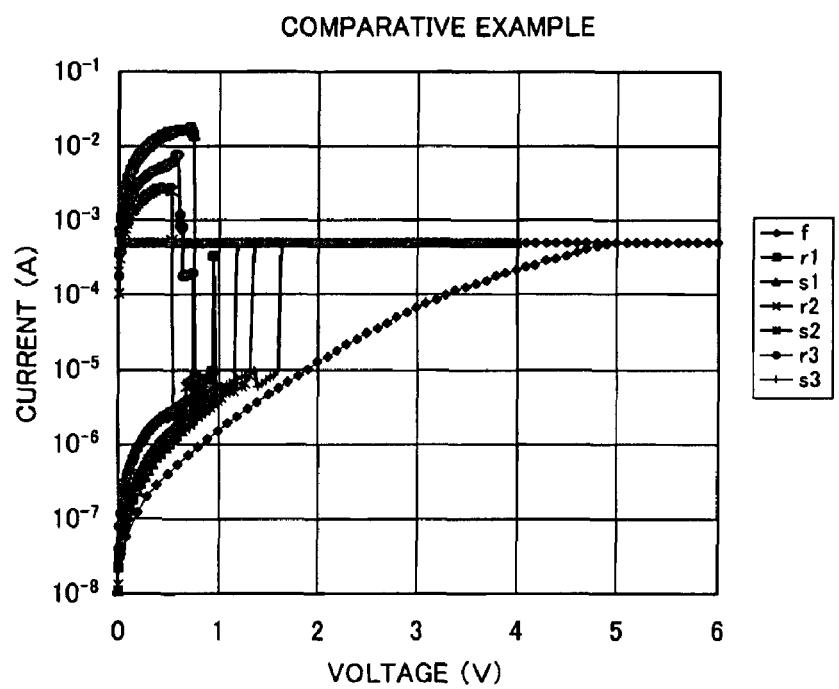
FIG. 5 is a view depicting the characteristic of a resistance change element according to a comparative example.

FIG. 5 is a view depicting the characteristic of a resistance change element having the structure in which a transition metal oxide film made of NiO is sandwiched in between an upper electrode and a lower electrode, both made of Pt (hereinafter referred to as a comparative example). The resistance change element according to the comparative example has a similar structure to that of the resistance change element according to the practical example, except that the lower electrode is made of Pt.

As can be seen from FIG. 4, in the resistance change element according to the practical example in which the lower electrode is made of Ni and the upper electrode is made of Pt, the voltage required for forming is approximately 1 V, which is low. In addition, in the resistance change element according to the practical example, the current of approximately 7 to 8 mA flows therethrough at the time of the first reset (r1). However, the current of approximately 1 mA only flows at the time of the second and later resets (r2, r3). Furthermore, in the resistance change element according to the practical example, the variation of the characteristic thereof at the time of set and reset after the second time is relatively small.

In contrast, as depicted in FIG. 5, in the resistance change element according to the comparative example in which both of the lower electrode and the upper electrode are made of Pt, the voltage required for forming is approximately 5 V, which is large, and the current flowing through the resistance change element at the first reset (r1) exceeds 10 mA. Accordingly, the amounts of currents at the time of the second and third resets (r2, r3) are also several mA or more, which are large. In addition, it can be seen from FIG. 5 that the variation of the characteristic thereof at the time of set and reset after the second time is larger as compared with that of the practical example.

Figure 6:
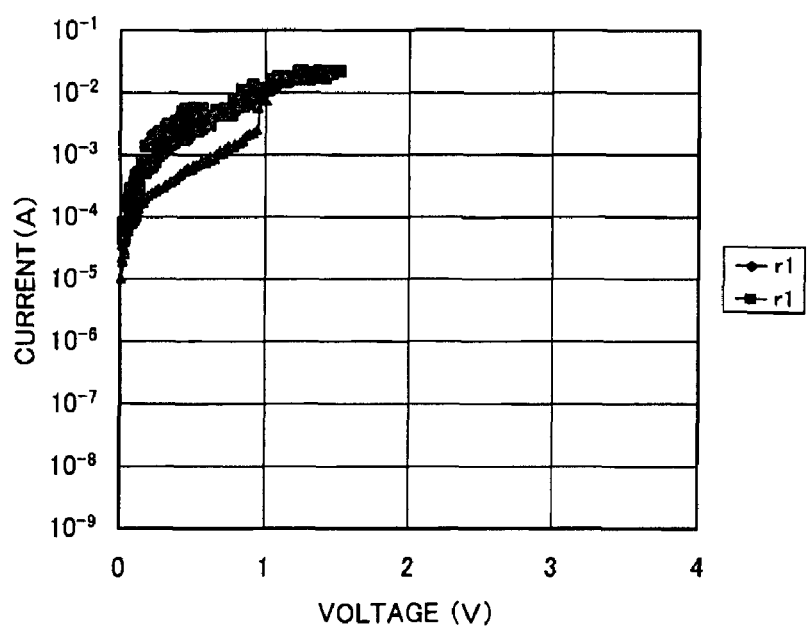
FIG. 6 is a view depicting the current-voltage characteristic of an element having an upper electrode and a lower electrode, both formed of Ni.

Note that, it is conceivable that both of the upper electrode and lower electrode of the resistance change element are formed of Ni. However, it has been found from the experiment carried out by the inventor of the present application and the like that if both of the upper electrode and the lower electrode are formed of Ni, a resistance change element is not formed. FIG. 6 is a view depicting the current-voltage characteristic of an element having an upper electrode and a lower electrode, both formed of Ni. As depicted in this FIG. 6, when both of the upper electrode and the lower electrode are formed of Ni, resistance change is not indicated and a resistance change element cannot be configured.

(ReRAM)

Figure 7:
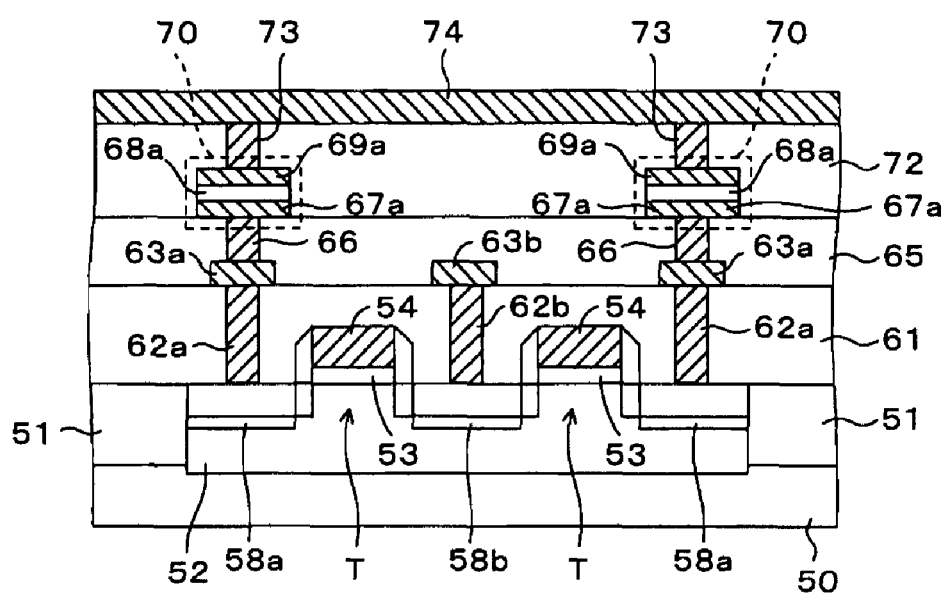
FIG. 7 is a view depicting one example of a ReRAM according to the first embodiment.

FIG. 7 is a cross-sectional view depicting one example of a ReRAM using the above-described resistance change element. Here, there is depicted an example in which the present invention is applied to a stack-type ReRAM. In addition, it is assumed that a memory cell is configured of an n-type transistor.

A semiconductor substrate 50 is separated into multiple element regions by an element isolation film 51. As depicted in FIG. 7, in the memory cell region, a p-well 52 formed by introducing a p-type impurity into the semiconductor substrate 50 is provided and two gate electrodes 54 are formed on this p-well 52 through a gate insulating film 53. These gate electrodes 54 are disposed so as to be parallel to each other. In addition, on both sides of the gate electrodes 54, high concentration impurity regions 58a, 58b formed by introducing an impurity with high concentration into the surface of the p-well 52 are disposed to configure a transistor T together with each gate electrode 54. It should be noted that the high concentration impurity region 58a is an impurity region (drain) disposed between the gate electrode 54 and the element isolation film 51. The high concentration impurity region 58b is an impurity region (source) disposed between the two gate electrodes 54. As depicted in this FIG. 7, in the present embodiment, the high concentration impurity region 58b is set to be an impurity region which is common in the two transistors (selection transistors) T.

These transistors T are covered with a first interlayer insulating film 61 formed on the semiconductor substrate 50. W plugs 62a, 62b are provided in this first interlayer insulating film 61. The W plugs 62a, 62b are formed by filling W (tungsten) into contact holes reaching the high concentration impurity regions 58a, 58b from the upper surface of the first interlayer insulating film 61. The W plug 62a is connected to the high concentration impurity region 58a and the W plug 62b is connected to the high concentration impurity region 58b.

A pad 63a and a wiring 63b are formed on the first interlayer insulating film 61. The pad 63a is disposed on the W plug 62a and is electrically connected to the W plug 62a. In addition, the wiring 63b passes on the W plug 62b and is electrically connected to the high concentration impurity region 58b through the W plug 62b.

A second interlayer insulating film 65 is formed on the first interlayer insulating film 61. The pad 63a and the wiring 63b are covered with this second interlayer insulating film 65. W plugs 66 are provided in this second interlayer insulating film 65. The W plugs 66 are formed by filling W into contact holes, each reaching the pad 63a from the upper surface of the second interlayer insulating film 65.

A resistance change element 70 is formed on the second interlayer insulating film 65 by laminating a lower electrode 67a made of Ni, a transition metal oxide film 68a made of NiOx, and an upper electrode 69a made of Pt. This resistance change element 70 is disposed on each W plug 66, while the lower electrode 67a is electrically connected to the high concentration impurity region 58a through the W plug 66, the pad 63a, and the W plug 62a. It should be noted that, in the present embodiment, the lower electrode (Ni film) 67a is directly formed on the interlayer insulating film 65 (and the W plug 66), but a Ti (titanium) or TiN (titanium nitride) film may be formed between the interlayer insulating film 65 (and the W plug 66) and the lower electrode 67a. With this configuration, the adhesiveness between the interlayer insulating film 65 and the lower electrode 67a is improved while the electrical connectivity between the W plug 66 and the lower electrode 67a is also improved.

A third interlayer insulating film 72 is formed on the second interlayer insulating film 65. The resistance change element 70 is covered with this third interlayer insulating film 72. W plugs 73 are provided in the third interlayer insulating film 72. The W plugs 73 are formed by filling W into contact holes, each reaching the upper electrode 69a of the resistance change element 70 from the upper surface of the third interlayer insulating film 72.

A wiring 74 is formed on the third interlayer insulating film 72. This wiring 74 is electrically connected to the upper electrode 69a of the resistance change element 70 through the W plug 73.

In the ReRAM configured as such, the wiring 74, the gate electrode 54 of each transistor T, and the wiring 63b respectively become a bit line, a word line, and a ground line. When the resistance change element 70 is set, the transistor T is turned on to apply a predetermined voltage to the resistance change element 70 through the wiring 74 (bit line) by setting the lower electrode 67a to a ground potential. Additionally, when the resistance change element 70 is reset, the transistor T is turned on to apply a predetermined current to the resistance change element 70 through the wiring (bit line) 74 by setting the lower electrode 67a to a ground potential. Furthermore, when the state of the resistance change element 70 is detected, the transistor T is turned on to check resistance between the wiring (bit line) 74 and the wiring 63b (ground line).

In the ReRAM according to the present embodiment, the resistance change element 70 is configured of the lower electrode 67a made of Ni, the transition metal oxide film 68a made of NiOx, and the upper electrode 69a made of Pt. Therefore, there is such an effect that the driving voltage is low and the driving current is small. With this effect, the ReRAM can be highly integrated to meet such demands that information apparatuses are further reduced in size and save power consumption while having higher functionality.

(First Manufacturing Method)

FIGS. 8A to 8H are cross-sectional views, each depicting a method of manufacturing the above-described ReRAM in the order of processes. In general, a memory cell as well as an n-type transistor and a p-type transistor which constitute driving circuits (a write circuit, a read circuit and the like) are formed on a semiconductor substrate, but are not depicted in the figures herein.

Figure 8A:
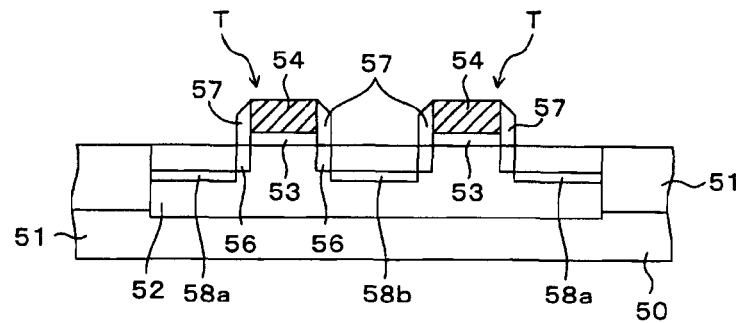
FIGS. 8A-8H are cross-sectional views depicting a method of manufacturing a ReRAM according to the first embodiment.

Firstly, the process to form the structure depicted in FIG. 8A will be described. As depicted in FIG. 8A, the element isolation film 51 is formed in a predetermined region in the semiconductor substrate (silicon substrate) 50 by the well-known STI (Shallow Trench Isolation) method or the LOCOS (Local Oxidation of Silicon) method. The surface of the semiconductor substrate 50 is separated into multiple element regions by the resultant element isolation film 51.

Next, a p-type impurity such as boron (B) is introduced into an n-type transistor forming region (a memory cell region and an n-type transistor forming region of the driving circuit; hereinafter, the same) in the semiconductor substrate 50 to form the p-well 52. In addition, an n-type impurity such as phosphorus (P) is introduced into a p-type transistor forming region (a p-type transistor forming region of the driving circuit; hereinafter, the same) in the semiconductor substrate 50 to form an n-well (unillustrated).

Subsequently, the surfaces of the p-well 52 and the n-well (unillustrated) are thermally oxidized to form the gate insulating film 53. After that, a polysilicon film is formed on the entire upper surface of the semiconductor substrate 50 by the CVD (Chemical Vapor Deposition) method. The resultant polysilicon film is patterned by the photolithography method and the etching method to form the gate electrodes 54. At this time, as depicted in FIG. 8A, in the memory cell region, the two gate electrodes 54 serving as word lines are disposed on one p-well 52 so as to be parallel to each other.

Thereafter, using the gate electrodes 54 as masks, an n-type impurity such as phosphorus (P) with low concentration is ion-implanted into the p-well 52 in the n-type transistor forming region, so that n-type low concentration impurity regions 56 are formed. Similarly, using the gate electrodes 54 as masks, a p-type impurity such as boron (B) with low concentration is ion-implanted into the n-well (unillustrated) in the p-type transistor forming region, so that p-type low concentration impurity regions (unillustrated) are formed.

Thereafter, side walls 57 are formed on both sides of the gate electrode 54. These side walls 57 are formed such that an insulating film made of $SiO_2$, SiN, or the like is formed on the entire upper surface of the semiconductor substrate 50 by the CVD method, and then the resultant insulating film is etched back to be left only on the both sides of the gate electrode 54.

Thereafter, using the gate electrode 54 and the side walls 57 as masks, an n-type impurity with high concentration is ion-implanted into the p-well 52 in the n-type transistor forming region, so that the n-type high concentration impurity regions 58a, 58b are formed. Similar to this, using the gate electrode in the p-type transistor forming region and the side walls as masks, a p-type impurity with high concentration is ion-implanted into the n-well (unillustrated), so that p-type high concentration impurity regions (unillustrated) are formed. In this manner, the transistor T having a source and a drain with an LDD (Lightly Doped Drain) structure is formed in each transistor forming region.

Figure 8B:
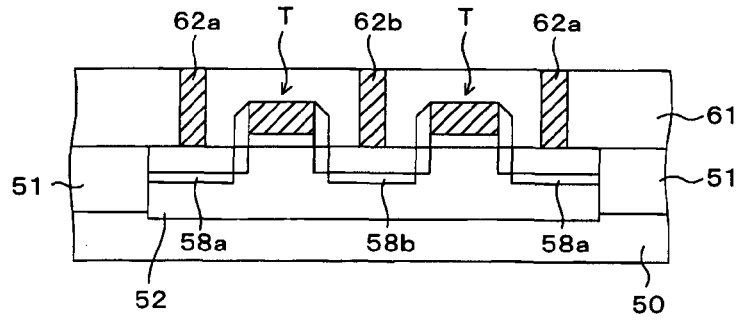

Next, the process to form the structure depicted in FIG. 8B will be described. After the transistor T is formed by the process described above, an $SiO_2$ film, for example, is formed as the first interlayer insulating film 61 on the entire upper surface of the semiconductor substrate 50 by the CVD method. The transistor T is covered with the resultant interlayer insulating film 61. After that, the surface of the first interlayer insulating film 61 is polished and planarized by the CMP (Chemical Mechanical Polishing) method.

Subsequently, by using the photolithography method and the etching method, contact holes reaching the n-type high concentration impurity regions 58a, 58b in the n-type transistor forming region from the upper surface of the first interlayer insulating film 61 are formed. After that, a TiN film (unillustrated) serving as a barrier metal is formed on the entire upper surface of the semiconductor substrate 50 by the sputtering method. Thereafter, a W film is formed on the TiN film by the sputtering method or the CVD method, while W is filled in the contact holes. After that, the W film and the TiN film are polished by the CMP method until the first interlayer insulating film 61 is exposed. In this manner, the W plugs 62a, 62b made by being filled with W are formed in the contact holes. Here, the W plug 62a is a plug connected to the high concentration impurity region 58a and the W plug 62b is a plug connected to the high concentration impurity region 58b.

Figure 8C:
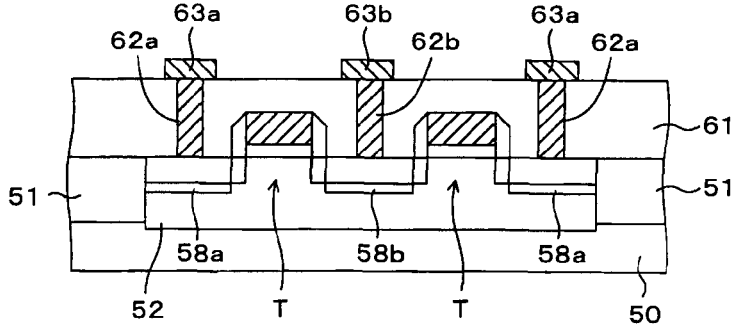

Next, the process to form the structure depicted in FIG. 8C will be described. After the W plugs 62a, 62b are formed by the process described above, a conducting film formed of a metal such as aluminum or copper is formed on the first interlayer insulating film 61 and the W plugs 62a, 62b by the sputtering method. Subsequently, the resultant conducting film is patterned by the photolithography method and the etching method to form the pad 63a and the wiring 63b. The pad 63a is formed on the W plug 62a and is electrically connected to the W plug 62a. In addition, the wiring 63b passes on the plug 62b and is electrically connected to the W plug 62b.

Figure 8D:
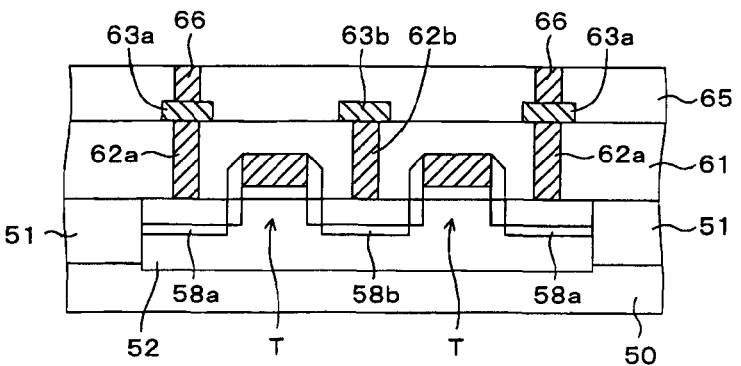

Next, the process to form the structure depicted in FIG. 8D will be described. After the pad 63a and the wiring 63b are formed by the process described above, the second interlayer insulating film 65 made of $SiO_2$ is formed on the entire upper surface of the semiconductor substrate 50 by the CVD method. Subsequently, the surface of the resultant second interlayer insulating film 65 is polished and planarized by the CMP method. Thereafter, by using the photolithography method and the etching method, contact holes, each reaching the pad 63a from the upper surface of the second interlayer insulating film 65, are formed. After that, a TiN film (unillustrated) serving as a barrier metal is formed on the entire upper surface of the semiconductor substrate 50 by the sputtering method. Thereafter, a W film is formed on the TiN film by the sputtering method or the CVD method, while W is filled in the contact holes. After that, the W film and the TiN film are polished by the CMP method until the second interlayer insulating film 65 is exposed. In this manner, the W plug 66 made by being filled with W is formed in the contact holes.

Next, the process to form the structure depicted in FIGS. 8E and 8F will be described. After the W plug 66 is formed by the process described above, a Ti or TiN film (unillustrated) is formed, with the thickness of, for example, 20 nm, on the second interlayer insulating film 65 and the W plug 66 by the sputtering method. This Ti or TiN film is not a must, but, as described above, serves to improve the adhesiveness between the interlayer insulating film 65 and the lower electrode 67a as well as the electrical connectivity between the W plug 66 and the lower electrode 67a.

Figure 8E:
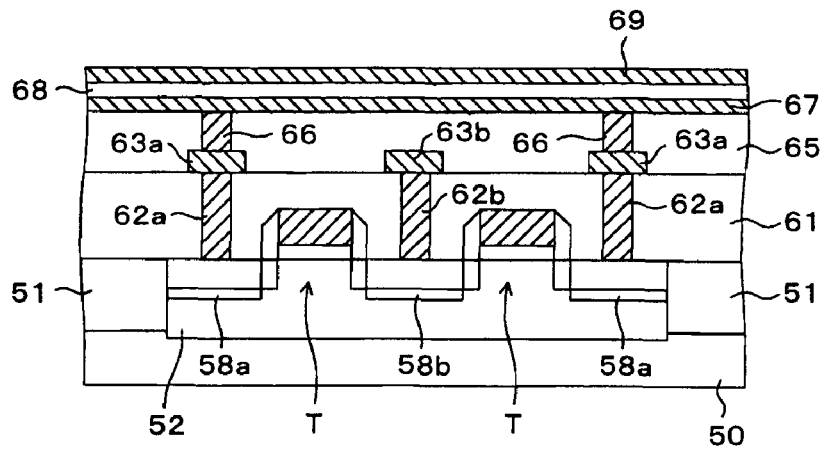
Figure 8F:
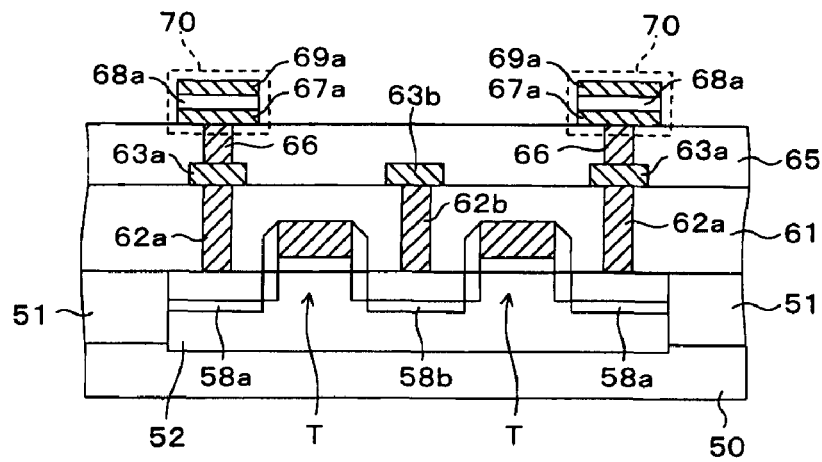

Thereafter, as depicted in FIG. 8E, by the sputtering method, an Ni film 67 serving as a lower electrode, an NiOx film 68 serving as a transition metal oxide film, and a Pt film 69 serving as an upper electrode are formed in this order on the second interlayer insulating film 65 and the W plug 66 (on the Ti or TiN film). In this case, the thickness of the Ni film 67 is, for example, 100 nm, the thickness of the NiOx film 68 is, for example, 50 nm, and the thickness of the Pt film 69 is, for example, 50 nm.

Thereafter, an antireflection film (unillustrated) made of TiN is formed on the Pt film 69 with the thickness of, for example, 50 nm. Note that, the antireflection film is formed in order to prevent light reflection in the next photolithography process. Therefore, this antireflection film may be formed if needed, and is not a must in the present embodiment.

Thereafter, a resist film (unillustrated) having a predetermined shape is formed on the Pt film 69 (on an antireflection film). By using the resultant resist film as a mask, the Pt film 69, the NiOx film 68, and the Ni film 67 are etched. As a result, as depicted in FIG. 8F, formed is the resistance change element 70 having the structure in which the lower electrode 67a made of Ni, the transition metal oxide film 68a made of NiOx, and the upper electrode 69a made of Pt are laminated.

Figure 8G:
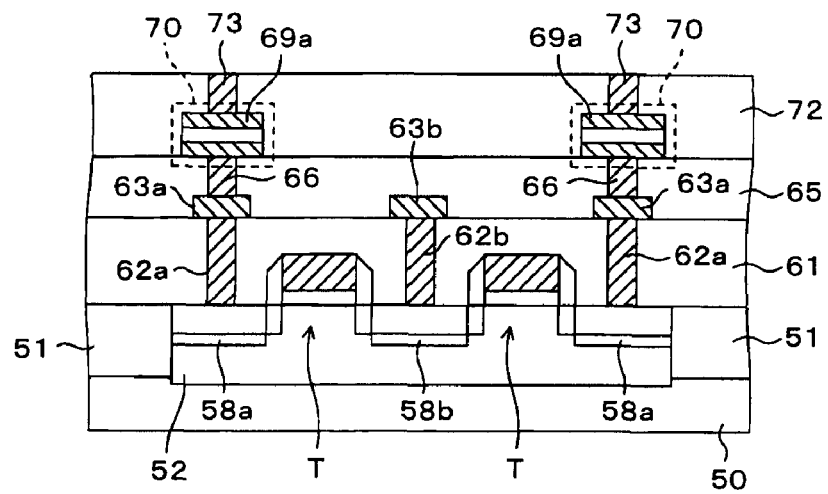
Figure 8H:
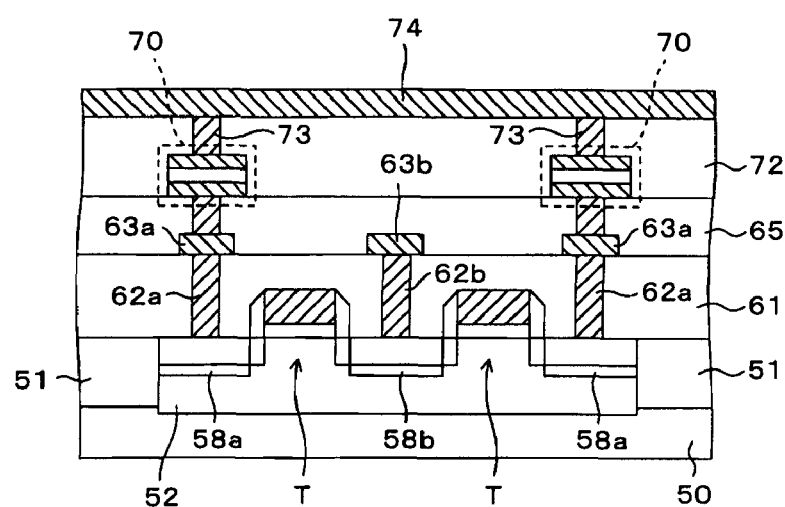

Next, the process to form the structure depicted in FIGS. 8G and 8H will be described. After the resistance change element 70 is formed by the process described above, as depicted in FIG. 8G, the third interlayer insulating film 72 made of SiO$_2$ is formed on the entire upper surface of the semiconductor substrate 50 by the CVD method. Subsequently, by using the photolithography method and the etching method, contact holes, each reaching the upper electrode 69a of the resistance change element 70 from the upper surface of the third interlayer insulating film 72, are formed. Thereafter, a TiN film (unillustrated) serving as a barrier metal is formed on the entire upper surface of the semiconductor substrate 50. After that, a W film is formed on the barrier metal by the sputtering method or the CVD method, while W is filled in the contact holes. Then, the W film and the TiN film are polished by the CMP method until the third interlayer insulating film 72 is exposed. In this manner, the W plug 73 electrically connected to the upper electrode 69a of the resistance change element 70 is formed.

Thereafter, a conducting film (unillustrated) having a laminated structure of TiN/Al/TiN/Ti, for example, is formed on the third interlayer insulating film 72 and the W plug 73 by the sputtering method. After that, the conducting film is patterned by the photolithography method and the etching method to form, as depicted in FIG. 8H, the wiring (bit line) 74. In this manner, the ReRAM according to the present embodiment is completed.

(Second Manufacturing Method)

Figure 9A:
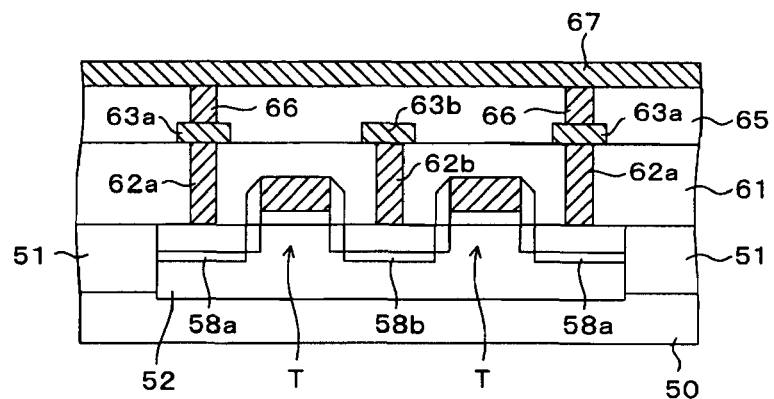
FIGS. 9A-9C are cross-sectional views depicting an example of another method of manufacturing a ReRAM according to the first embodiment.

In the above-described manufacturing method, in the resistance change element 70, the NiOx film 68 serving as a transition metal oxide film is formed on the Ni film 67 serving as a lower electrode by the sputtering method. However, the NiOx film 68 may be formed in the following manner. That is, as depicted in FIG. 9A, similar to the first manufacturing method, the transistor T, the first interlayer insulating film 61, the W plugs 62a, 62b, the second interlayer insulating film 65, and the W plug 66 are formed on the semiconductor substrate 50. After that, by the sputtering method, the Ni film 67 is formed with the thickness of, for example, 100 nm on the second interlayer insulating film 65 and the W plug 66. It is preferable that a Ti or TiN film be formed between the interlayer insulating film 65 and the Ni film 67, and between the W plug 66 and the Ni film 67.

Figure 9B:
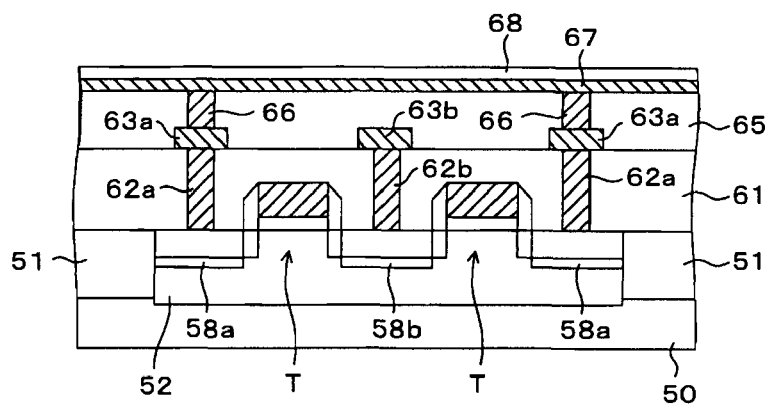

Subsequently, as depicted in FIG. 9B, the Ni film 67 is heated at the temperature of 400° C. in an oxidizing atmosphere. As a result, the surface of the Ni film 67 is oxidized and the NiOx film 68 with the thickness of 50 nm is formed.

Figure 9C:
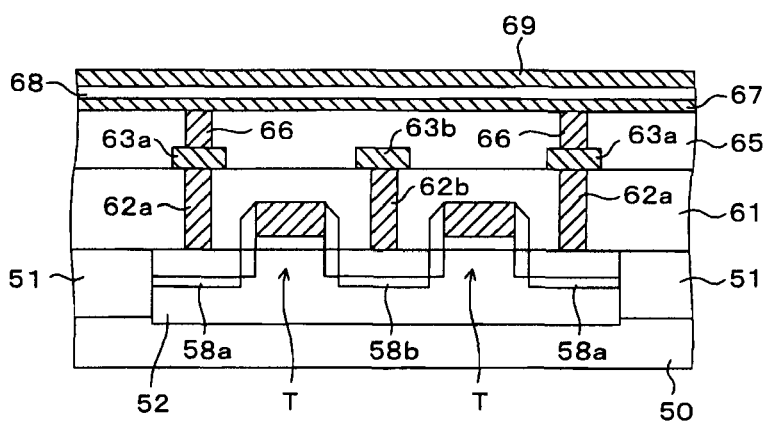

Thereafter, as depicted in FIG. 9C, the Pt film 69 serving as an upper electrode and an antireflection film (unillustrated) made of TiN are formed on the NiOx film 68 by the sputtering method. The process thereafter is similar to that of the first manufacturing method, and the description thereof will be omitted. In this manner, a ReRAM according to the present embodiment can be manufactured.

The present embodiment has been described by using the example in which the present embodiment is applied to a stack-type ReRAM. However, the present embodiment is also applicable to a planer-type ReRAM.

2. Second Embodiment

Figure 10:
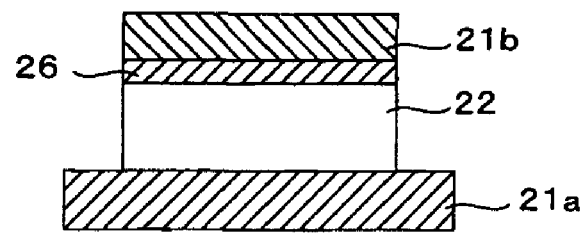
FIG. 10 is a cross-sectional view depicting a resistance change element according to a second embodiment.

FIG. 10 is a cross-sectional view depicting a resistance change element according to a second embodiment. In this FIG. 10, the same reference numerals are given to denote the same components as those of FIG. 3.

As depicted in FIG. 10, the resistance change element according to the present embodiment is configured of a lower electrode (ground-side electrode) 21a made of Ni, a transition metal oxide film 22 made of NiOx, a noble metal oxide film 26 made of PtOx, and an upper electrode (positive polarity-side electrode) 21b made of Pt.

In the above-described first embodiment, the description has been given of the case where the lower electrode 21a is formed of a transition metal such as Ni so that the driving current can be reduced and the variation of the characteristics is smaller, as compared with the case of the conventional resistance change element having the lower electrode made of a noble metal such as Pt. However, it has been found that the variation of the resistance values in the high resistance state is relatively large in the resistance change element according to the first embodiment.

Figure 11:
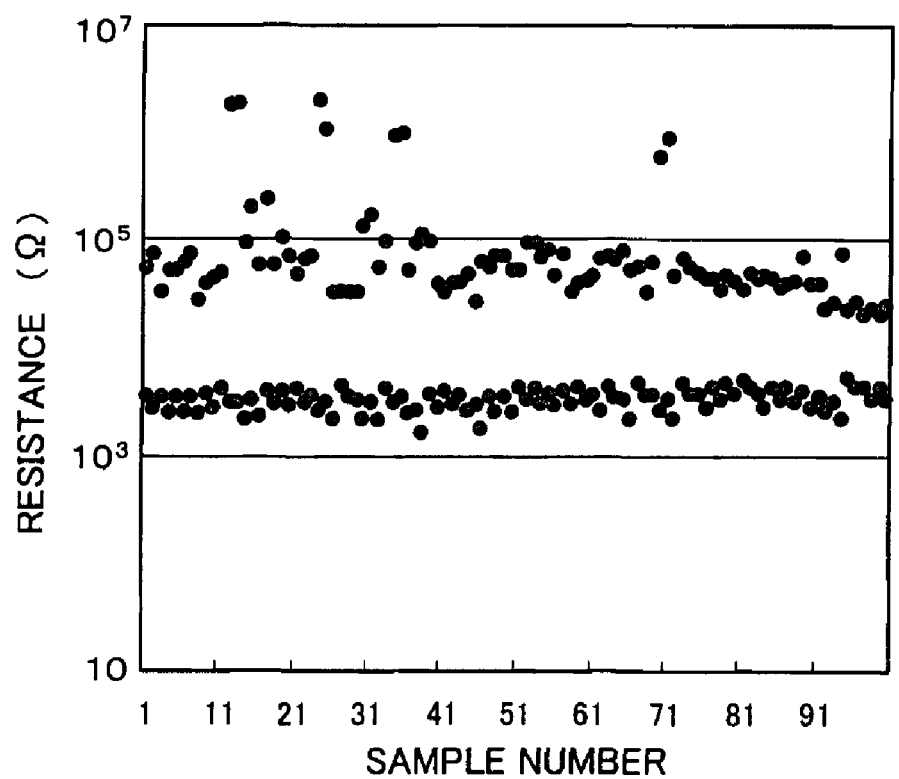
FIG. 11 is a view depicting the results of checking resistance values in a low resistance state and a high resistance state of the one hundred resistance change elements according to the first embodiment.

FIG. 11 is a view depicting the results of checking the resistance values in the low resistance state and the high resistance state of the one hundred resistance change elements according to the first embodiment by taking the horizontal axis as sample number and the vertical axis as resistance value. It can be seen from this FIG. 11 that in the resistance change elements according to the first embodiment, the variation of the resistance values in the low resistance state is small but the variation of the resistance values in the high resistance state is relatively large.

The inventor of the present application and the like have carried out various experiments and studies with an intention to reduce the variation of the resistance values in the high resistance state. As a result, the following results have been obtained. That is, in the resistance change element depicted in FIG. 3, NiOx constituting the transition metal oxide film 22 is deoxidized when changing from the high resistance state to the low resistance state (at the time of set), so that NiOx is separated into Ni and O (oxygen). In contrast, when changing from the low resistance state to the high resistance state (at the time of reset), Ni reacts with O (oxygen) to generate NiOx. A part of O (oxygen) generated at the time of set diffuses in the transition metal oxide film 22 and reacts with Pt constituting the upper electrode 21b to generate PtOx, or transmits the upper electrode 21b to dissipate to the outside. As a result, there is not enough amount of O (oxygen) in the transition metal oxide film 22 at the time of reset. This is presumably the cause of generating the variation of the resistance values in the high resistance state.

For this reason, in the present embodiment, as depicted in FIG. 10, the noble metal oxide film 26 made of PtOx is formed between the transition metal oxide film 22 and the upper electrode 21b. With this configuration, when changing from the low resistance state to the high resistance state, oxygen is supplied from the noble metal oxide film 26 to the transition metal oxide film 22, so that oxidation reaction of NiOx constituting the transition metal oxide film 22 is stabilized. The noble metal oxide film 26 may be formed of a conductive oxidation material such as IrOx (iridium oxide) or RuOx (ruthenium oxide) in place of PtOx.

Figure 12:
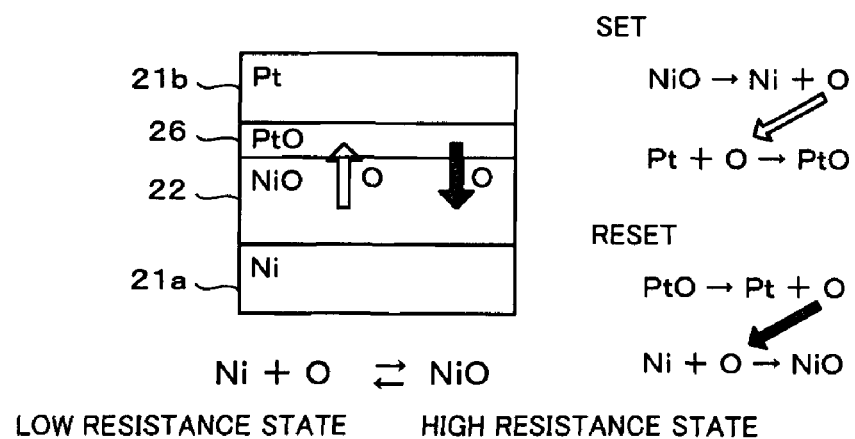
FIG. 12 is a view schematically depicting the movement of O (oxygen) accompanying the state change between the low resistance state and the high resistance state in the resistance change element according to the second embodiment.

FIG. 12 is a view schematically depicting the movement of O (oxygen) accompanying the state change between the low resistance state and the high resistance state in the resistance change element according to the present embodiment. As depicted in this FIG. 12, in the resistance change element according to the present embodiment, the noble metal oxide film 26 serves as a buffer to resolve the shortage of oxygen caused by the oxidation and deoxidation reactions of the transition metal oxide film 22.

Figure 13:
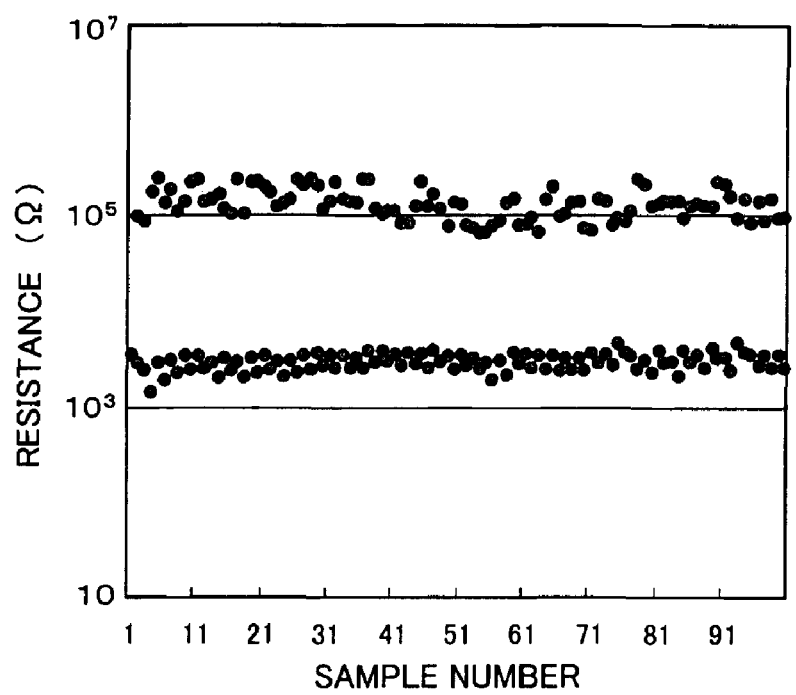
FIG. 13 is a view depicting the results of checking the resistance values in a low resistance state and a high resistance state of the one hundred resistance change elements according to the second embodiment.

FIG. 13 is a view depicting the results of checking the resistance values in the low resistance state and the high resistance state of the one hundred resistance change elements according to the present embodiment by taking the horizontal axis as sample number and the vertical axis as resistance value. As can be seen from the comparison between FIGS. 13 and 10, in the resistance change element according to the present embodiment, the variation of the resistance values in the high resistance is suppressed as compared with that of the resistance change element according to the first embodiment, and the mean value of the resistance values in the high resistance state is higher than that of the resistance change element according to the first embodiment. As a result, the reliability of the resistance change element according to the present embodiment is further improved as compared with that of the resistance change element according to the first embodiment.

Hereinafter, with reference to FIGS. 14A to 14D, a method of manufacturing a ReRAM using the resistance change element according to the present embodiment will be described. Note that, in FIGS. 14A to 14D, the same reference numerals are given to denote the same components as those of FIGS. 8A to 8H.

Figure 14A:
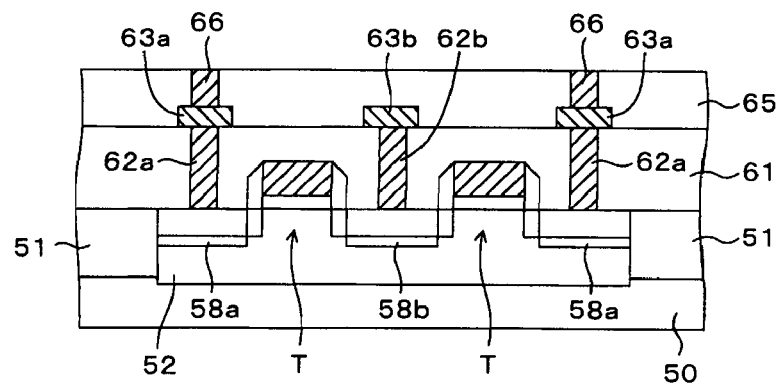
FIGS. 14A-14D are cross-sectional views depicting a method of manufacturing a ReRAM according to the second embodiment.

Firstly, similar to the first embodiment, as depicted in FIG. 14A, an element isolation film 51, a p-well 52, a transistor T, a first interlayer insulating film 61, W plugs 62a, 62b, a pad 63a, a wiring 63b, a second interlayer insulating film 65, and a W plug 66 are formed on a semiconductor substrate 50.

Figure 14B:
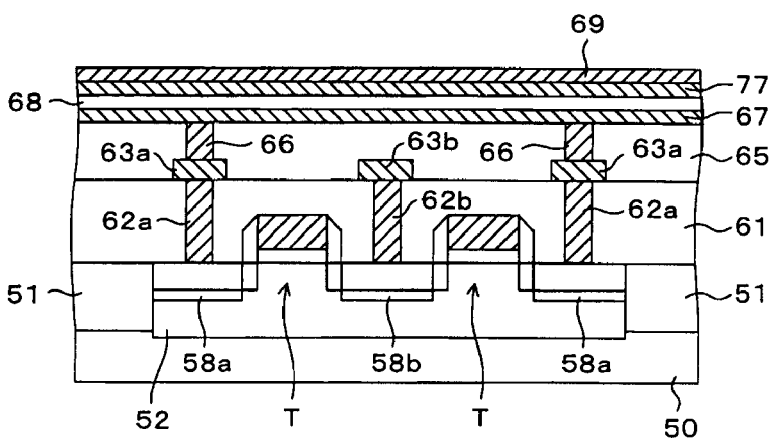

Subsequently, as depicted in FIG. 14B, on the second interlayer insulating film 65 and the W plug 66, a Ti or TiN film (unillustrated) is formed with the thickness of, for example, 20 nm by the sputtering method. Thereafter, by the sputtering method, an Ni film 67 serving as a lower electrode, an NiOx film 68 serving as a transition metal oxide film, a PtOx film 77 serving as a noble metal oxide film, and a Pt film 69 serving as an upper electrode are formed in this order. The thickness of the Ni film 67 is, for example, 100 nm, the thickness of the NiOx film 68 is, for example, 50 nm, the thickness of the PtOx film 77 is, for example, 20 to 30 nm, and the thickness of the Pt film 69 is, for example, 30 to 50 nm. In addition, an antireflection film (unillustrated) made of TiN is formed with the thickness of, for example, 50 nm on the Pt film 69. It should be noted that the PtOx film 77 is formed by sputtering Pt in an atmosphere containing argon (Ar) and oxygen ($O_2$).

Figure 14C:
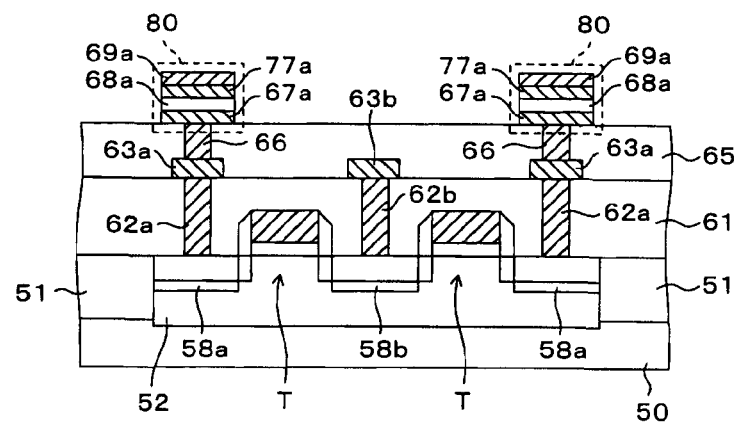

Thereafter, a resist film (unillustrated) having a predetermined shape is formed on the Pt film 69 (on the antireflection film). By using the resultant resist film as a mask, the Pt film 69, the PtOx film 77, the NiOx film 68, and the Ni film 67 are etched. As a result, as depicted in FIG. 14C, formed is a resistance change element 80 having the structure in which the lower electrode 67a made of Ni, the transition metal oxide film 68a made of NiOx, the noble metal oxide film 77a made of PtOx, and the upper electrode 69a made of Pt are laminated.

Figure 14D:
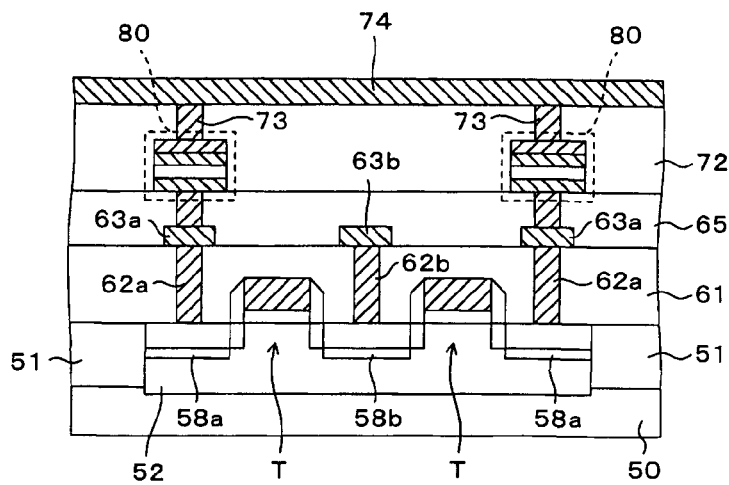

Next, as depicted in FIG. 14D, a third interlayer insulating film 72 made of $SiO_2$ is formed on the entire upper surface of the semiconductor substrate 50. Subsequently, the resistance change element 80 is covered with this third interlayer insulating film 72. Thereafter, by using the photolithography method and the etching method, contact holes, each reaching the upper electrode 69a of the resistance change element 80 from the upper surface of the third interlayer insulating film 72, are formed. After that, a TiN film (unillustrated) serving as a barrier metal is formed on the entire upper surface of the semiconductor substrate 50. Then, a W film is formed on the barrier metal by the sputtering method or the CVD method, and W is filled in the contact holes. Finally, the W film and the TiN film are polished by the CMP method until the third interlayer insulating film 72 is exposed. In this manner, a W plug 73 electrically connected to the upper electrode 69a of the resistance change element 80 is formed.

Thereafter, a conducting film (unillustrated) having the laminated structure of TiN/Al/TiN/Ti, for example, is formed on the third interlayer insulating film 72 and the W plug 73 by the sputtering method. After that, the conducting film is patterned by the photolithography method and the etching method to form a wiring (bit line) 74. In this manner, the ReRAM according to the present embodiment is completed.

In addition, as described in the second manufacturing method according to the first embodiment, the NiOx film 68 may be formed by oxidizing the surface of the Ni film 67.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A resistance change memory comprising
   a transistor and
   a resistance change element,
   and storing data by utilizing change in a resistance value of the resistance change element,
   the resistance change element comprising:
      a ground-side electrode made of only one metal which is a transition metal and which is not a noble metal;
      a positive polarity-side electrode made of any one of a noble metal and a noble metal oxide; and
      a transition metal oxide film made of an oxide of only one metal which is the same as the one metal constituting the ground-side electrode and disposed between the ground-side electrode and the positive polarity-side electrode,
   wherein the ground-side electrode is connected to a ground line through the transistor, and the positive polarity-side electrode is connected to a bit line.

2. The resistance change memory according to claim 1, wherein the ground-side electrode is made of Ni while the transition metal oxide film is made of NiOx (where x is any positive number).

3. The resistance change memory according to claim 1, further comprising an oxide film, which is capable of supplying the transition metal oxide film with oxygen, between the transition metal oxide film and the positive polarity-side electrode.

4. The resistance change memory according to claim 1, wherein the positive polarity-side electrode is made of a noble metal while a noble metal oxide film is formed between the positive polarity-side electrode and the transition metal oxide film.

5. The resistance change memory according to claim 1, wherein the oxide of the transition metal oxide film includes no dopant.

* * * * *